United States Patent [19]

Price et al.

[11] Patent Number: 5,271,325
[45] Date of Patent: Dec. 21, 1993

[54] SCREEN WIPER ASSEMBLY FOR A PRINTING SCREEN

[76] Inventors: Charles W. Price; Wolfgang Schmidt, both of 215 Rte. 173 East, Bloomsbury, N.J. 08804

[21] Appl. No.: 836,237

[22] Filed: Feb. 18, 1992

[51] Int. Cl.⁵ .............................................. B41F 35/00
[52] U.S. Cl. .................................... 101/423; 101/424; 101/425
[58] Field of Search ............... 101/423, 424, 425, 123; 15/97.1; 29/829; 425/811

[56] References Cited

U.S. PATENT DOCUMENTS

| | | | |
|---|---|---|---|
| 1,700,453 | 1/1929 | Schultz | 101/425 |
| 1,760,049 | 5/1930 | Ecker, Jr. | 101/425 |
| 3,771,446 | 11/1973 | Kaneko et al. | 101/425 |
| 4,389,936 | 6/1983 | Jaffa et al. | 101/123 |
| 4,509,455 | 4/1985 | Shirataki | 101/123 |
| 4,911,074 | 3/1990 | Simila | 101/425 |
| 5,070,782 | 12/1991 | Sakai et al. | 101/425 |

FOREIGN PATENT DOCUMENTS

| | | | |
|---|---|---|---|
| 0209158 | 9/1986 | Japan | 101/425 |
| 0158255 | 7/1988 | Japan | 101/425 |

Primary Examiner—Edgar S. Burr
Assistant Examiner—Anthony H. Nguyen
Attorney, Agent, or Firm—Ezra Sutton

[57] ABSTRACT

A screen wiper assembly for cleaning the underside of a printing screen in a microcircuit thick film printer. The assembly includes a wiper blade, a movable arm for moving the wiper blade under the printing screen, and a guiding cam and roller for guiding and controlling the movement of the wiper blade.

10 Claims, 3 Drawing Sheets

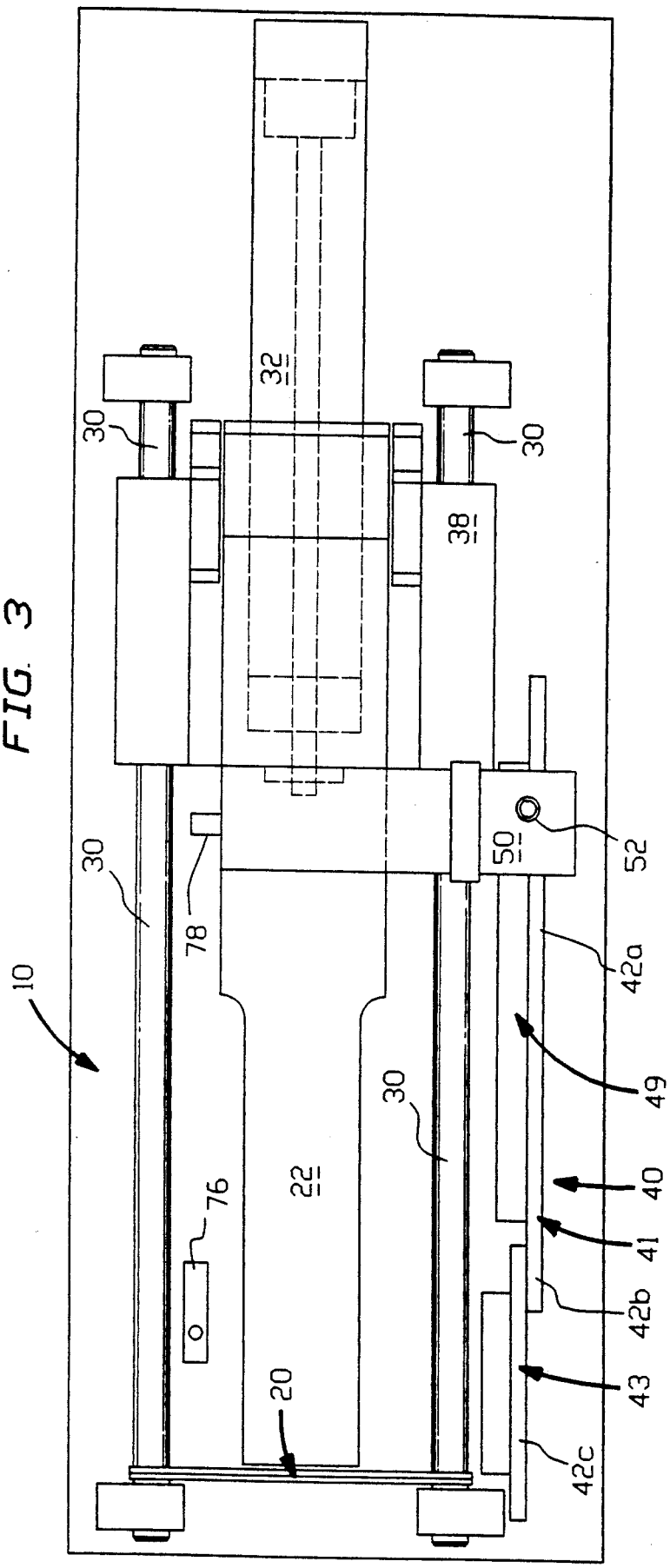

SCREEN WIPER ASSEMBLY FOR A PRINTING SCREEN

FIELD OF THE INVENTION

The present invention relates to a screen wiper assembly for cleaning the underside of a printing screen in a microcircuit thick film printer and any printer used in the microelectronics field.

BACKGROUND OF THE INVENTION

Microcircuit thick film printers include a squeegee for printing on substrates. As a result, some material is left on the bottom of the printing screen after printing on a substrate, materials such as conductors, resistors, dielectrics, solders, epoxies, tungsten, molybdenum, and others. The conductors contain precious metals, such as gold, silver, and palladium. The resistors contain exotic materials, such as ridium and ruthenium. The dielectrics contain alumina oxide, silica, glass frit, and like materials. If the excess material is not cleaned off the bottom surface of the printing screen, eventually a smudged print is obtained, and it must be wiped off to get a clear print.

Presently, the underside of the printing screen is cleaned by hand, wiping it with a lint-free cloth, urethane foam, and like products using a circular motion or a linear motion. Some wiping machines are available using a web under the screen to wipe clean the screen, and as the wiping action takes place, a take-up mechanism is used to roll up the cloth.

Present devices have a number of drawbacks. First, the excess material is lost in the cleaning cloth or web and cannot be reclaimed and re-used instantly. It can be reclaimed later at extra expense. Secondly, production is slower, and at times, additional personnel are required to perform the wiping operation. Present devices are not available for thick film printers and printers used in microelectronics.

It is the object of the present invention to overcome the aforesaid drawbacks and to provide an automatic screen wiper assembly for wiping and cleaning the underside of the printing screen, which allows the wiped material to be reclaimed and not wasted, which increases production and which reduces the personnel and labor required.

SUMMARY OF THE INVENTION

In accordance with the present invention, there is provided a screen wiper assembly for wiping and cleaning the underside of the printer screen in a microcircuit thick film printer used to print materials, such as conductors, resistors, dielectrics, solders, epoxies, tungsten, molybdenum, and other materials. The wiper assembly includes a wiper blade for contacting, cleaning, and wiping the underside of the printing screen, and a movable arm movable in first and second directions and having the wiper blade removably mounted thereon. A pneumatic assembly is provided for moving the movable arm and the wiper blade in the first and second directions between a first position in which the wiper blade is out of contact with the printing screen and a second position in which the wiper blade is in contact with the printing screen. A guide cam is provided for guiding the movable arm as it moves between the first and second positions, the guide cam operating to move the wiper blade into pressure contact with the underside of the printing screen to wipe and clean the underside of the printing screen.

BRIEF DESCRIPTION OF THE DRAWINGS

Further objects, features, and advantages of the present invention will become apparent upon consideration of the detailed description of the presently-preferred embodiment, when taken in conjunction with the accompanying drawings wherein:

FIG. 3 is a top view of the screen wiper assembly.

DETAILED DESCRIPTION OF THE PREFERRED EMBODIMENT

Figure 1:
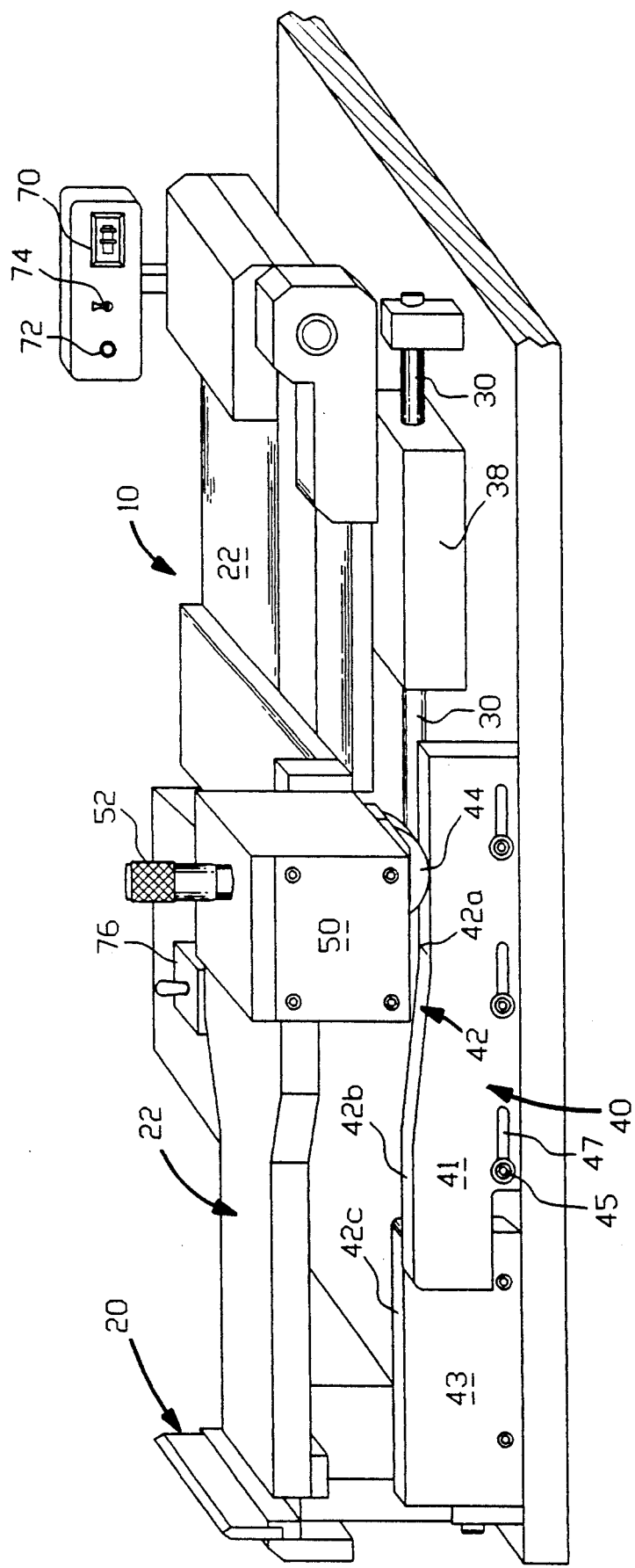
FIG. 1 is a perspective view of the screen wiper assembly of the present invention.
Figure 2:
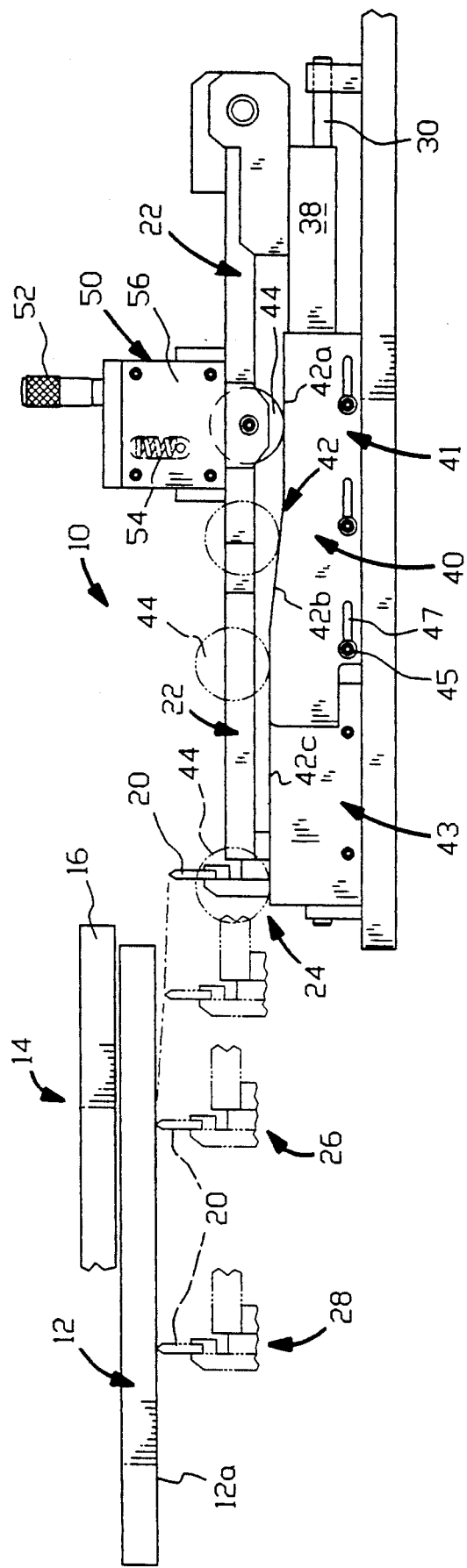
FIG. 2 is a side elevational view of the screen wiper assembly of the present invention.

Referring to FIGS. 1 and 2, there is shown a screen wiper assembly 10 for wiping and cleaning the underside 12a of a printing screen 12 in a microcircuit thick film printer 14 used to print substrates with materials, such as conductors, resistors, and dielectrics. As is known in the art, screen 12 is supported by a screenholder 16, and a squeegee is used to print.

The wiper blade is at 20, which contacts, cleans, and wipes the underside 12a of the printing screen 12. Wiper blade 20 is removably mounted on a movable arm 22 which is connected to a carrier 38. Movable arm 22 is movable horizontally in two directions between a first position 24, an intermediate position 26 where the blade 20 first comes into pressure contact with the underside 12a of printing screen 12, and a second position 28, which is the end of the forward stroke. At this point, the blade 20 reverses direction and begins its reverse stroke.

Movable arm 22 reciprocates on longitudinal rods 30 between the first position 24 and the second position 28 and is driven by a pneumatic piston system 32. Alternatively, a pneumatic cylinder or a lead screw may be used, or any similar device.

A guide assembly 40 is provided which includes a stationary member 43 and an adjustable member 41, which is adjustable with bolts 45 extending through elongated slots 47 and engaging bracket 49 (see FIG. 3). Members 41 and 43 define a guiding surface 42 in the form of a cam surface 42. A roller 44 is provided for engaging and riding on cam surface 42. The roller 44 is connected to movable arm 22 to control and guide the movement of the movable arm 22 between positions 24 and 28. Cam surface 42 and roller 44 operate to move the wiper blade 20 into pressure contact with the underside 12a of the printing screen 12 to wipe and clean the underside 12a. Cam surface 42 is comprised of three sections 42a, 42b and 42c, and section 42c moves blade 20 into pressure contact with the underside 12a of screen 12. By adjusting member 41, the point 26 at which the blade 20 engage the underside 12a of printing screen 12 can be varied.

Movement of movable arm 22 is coordinated and timed with the movement of the squeegee on the printer. That is, after the squeegee completes the printing operation and is withdrawn from the printing screen 12, then the movable arm 22 moves forward to engage the underside 12a of the printing screen 12 to wipe and clean it. A counter 70 is included for counting the preset number of times that the squeegee has operated, before the movable arm 22 moves forward. Also, a manual override 72 and on-off switch 74 is provided, as shown in FIG. 1. The counter 70 is preset by the operator to control when the movable arm 22 will operate. A limit switch 76 (see FIG. 3) is provided for actuating the movable arm 22 to change the direction of movement after its forward stroke to start the reverse stroke. When tab 78 hits limit switch 76, the reverse stroke starts.

Wiper blade 20 may be formed from any number of flexible and bendable materials, such as polyurethane, plastic, polymer, Teflon, silicon, lint-free cloth, or metal. Alternatively, the blade 20 may be coated with such materials. In this manner, the wiper blade 20 flexes and bends in response to pressure contact between the wiper blade 20 and the underside 12a of printing screen 12. The width of blades 20 may be of any suitable size, such as from 4" to 16" or larger.

Wiper setting adjustment 50 includes adjusting micrometer 52, spring 54, and housing 56, which is connected to roller 44. In this manner, micrometer 52 can be rotated for adjusting the pressure contact between the wiper blade 20 and the underside 12a of the printing screen 12. The amount of adjustment may be varied by an inch or more.

Advantageously, as a result of the present invention, the material left on the wiper blade of the present invention, the material left on the wiper blade with a spatula and placing it on the printing screen. Another advantage is that it is no longer necessary to have an additional person cleaning the bottom of the screen. With the present invention, the person operating the printer can also use the spatula to remove the excess material from the emulsion side of the screen.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

What is claimed is:

1. A screen wiper assembly for wiping and cleaning the underside of the printer screen in a microcircuit thick film printer used to print materials, such as conductors, resistors, dielectrics, solders, epoxies, tungsten, molybdenum, and other materials, comprising:

a wiper blade for contacting, cleaning, and wiping the underside of the printing screen;

said wiper blade being formed of a material which flexes or bends in response to pressure contact between said wiper blade and the underside of said printing screen;

a movable arm movable in first and second directions and having said wiper blade removably mounted thereon;

means for moving said movable arm and said wiper blade in said first and second directions between a first position in which said wiper blade is out of contact with said printing screen and a second position in which said wiper blade is in contact with said printing screen;

guide means for guiding said movable arm as said movable arm moves between said first and second positions, said guide means operating to move said wiper blade into pressure contact with the underside of the printing screen to wipe and clean the underside of the printing screen; and means for coordinating and timing the movement of said movable arm and said wiper blade with said printer.

2. A screen wiper assembly in accordance with claim 1, wherein said guide means includes a guiding surface in the form of a cam surface and follower means in the form of a roller for engaging and riding on said cam surface, said follower means being connected to said movable arm to control and guide the movement of said movable arm and said wiper blade between said first and second positions.

3. A screen wiper assembly in accordance with claim 1, wherein said means for moving said movable arm and said wiper blade includes a pneumatically driven piston rod connected to said movable arm for reciprocating said movable arm and said wiper blade in said first and second directions between said first and second positions.

4. A screen wiper assembly in accordance with claim 1, wherein said coordinating means includes a counter for counting the number of times that said printer has operated to move the substrate carrier, and said counter includes means for presetting the counter and a manual override.

5. A screen wiper assembly in accordance with claim 1, wherein said wiper blade is formed from a group consisting of polyurethane, polymer, silicon, lint-free cloth, or metal.

6. A screen wiper assembly in accordance with claim 1, further including means for adjusting the pressure contact between said wiper blade and the underside of said printing screen by adjusting the position of said wiper blade by a half of an inch or more.

7. A screen wiper assembly in accordance with claim 1, wherein said means for moving said movable arm includes means for adjusting the distance between said first and second positions.

8. A screen wiper assembly in accordance with claim 1, further including limit switches for actuating said moving means to change the direction of movement of said movable arm and said wiper blade.

9. A screen wiper assembly in accordance with claim 2, wherein said cam surface and said roller maintain pressure contact between said wiper blade and the underside of said printing screen during movement in said first and second directions.

10. A screen wiper assembly in accordance with claim 1, wherein said wiper blade is mounted such that the screen wiping action is uniform over the entire area of the underside of the printing screen.

* * * * *

UNITED STATES PATENT AND TRADEMARK OFFICE
CERTIFICATE OF CORRECTION

PATENT NO.    : 5,271,325
DATED         : December 21, 1993
INVENTOR(S)   : Charles W. Price; Wolfgang Schmidt It is certified that error appears in the above—identified patent and that said Letters Patent is hereby corrected as shown below:

Column 2, line 56, change "engage" to --engages--.

Column 3, lines 24 and 25, delete "of the present invention, the material left on the wiper blade".

Column 3, line 24, after "blade", insert --is reclaimed and reused by removing it from the wiper blade--.

Signed and Sealed this

Twenty-sixth Day of April, 1994

*Attest:*

BRUCE LEHMAN

*Attesting Officer*  Commissioner of Patents and Trademarks